United States Patent [19]

Sakamoto

[11] 4,250,454
[45] Feb. 10, 1981

[54] ELECTRONIC TRIGGER FOR A RADIO FREQUENCY SOURCE

[75] Inventor: Norman Y. Sakamoto, Los Angeles, Calif.

[73] Assignee: International Telephone and Telegraph Corporation, New York, N.Y.

[21] Appl. No.: 23,823

[22] Filed: Mar. 26, 1979

[51] Int. Cl.³ ............................................... H03K 5/26
[52] U.S. Cl. ........................................ 328/155; 328/55; 328/73; 343/17.1 R; 331/1 A
[58] Field of Search ................... 328/155, 71, 72, 73, 328/75, 55; 343/17.1 R; 331/1 A

[56] References Cited

U.S. PATENT DOCUMENTS

| | | | |
|---|---|---|---|
| 3,774,019 | 11/1973 | Cook | 343/17.1 R |
| 3,958,184 | 5/1976 | Bock et al. | 328/155 |
| 4,058,810 | 11/1977 | Bryden | 343/17.1 R |
| 4,166,249 | 8/1979 | Lynch | 328/155 |
| 4,190,807 | 2/1980 | Weber | 331/1 A |

*Primary Examiner*—John S. Heyman
*Attorney, Agent, or Firm*—William T. O'Neil

[57] ABSTRACT

An electronic trigger circuit for an RF source, which electronic trigger may be advantageously used in a radar apparatus, for instance. The trigger employs digital logic devices including a register or counter, a circuit for initiating counting in the register in response to a received pretrigger signal and a circuit responsive to the occurrence of selected count in the register for enabling the RF source. A timing signal is generated, based upon the pretrigger signal in timed relationship to the time at which the RF source should nominally generate its RF signal. Typically, the RF source generates its RF signal at sometime after being enabled. A comparator circuit is provided for comparing the phase relationship of the aforementioned timing signal and the occurrence of the RF signal and is in turn coupled to an arithmetic circuit effective for altering the number of states through which the register counts. Preferably, the arithmetic circuit alters the number of states only when the comparison circuit indicates that the phase relationship differs by some preselected period of time. Thus, each time the RF source is fired, its output is compared with the time at which the output should nominally occur and when this difference exceeds a predetermined amount, the amount of delay between the time the pretrigger signal is received and the time the RF source is enabled is varied by changing the number of states through which the aforementioned register counts.

13 Claims, 6 Drawing Figures

ELECTRONIC TRIGGER
BLOCK DIAGRAM

TIMING DIAGRAM

ELECTRONIC TRIGGER FOR A RADIO FREQUENCY SOURCE

BACKGROUND OF THE INVENTION

This invention relates to electronic triggers for Radio Frequency (RF) sources and more particularly to a highly stabilized electronic trigger for an RF source such as is used in a radar transmitter.

Electromagnetic range finding systems, such as radars, frequently emit an RF signal for the purpose of detecting targets which reflect the transmitted RF signal back to the range finding apparatus. Of course, as is well known, the time difference between the time the RF signal is emitted and the time at which it is received is indicative of the distance the target is from the transmitter and a changing phase of the returned signal is indicative of a moving target. Radar systems capable of detecting this phase change are known as Moving Target Indication (MTI) radars.

It is of considerable importance to designers of such apparatus that not only the time at which the RF signal is transmitted be known but also that the RF signal be transmitted at a preselected time or at least within a preselected period. The transmitted RF signal originates, of course, at an RF source which may be provided, for example, by a magnetron, a klystron, or a more conventional oscillator coupled to an RF power tube. The magnetron is a popular RF source for use with radar transmitters because of its compact size, low weight, low cost, high efficiency and low source of X-rays. However, the magnetron also has several disadvantages which include the fact that it has no phase coherence between consecutive pulses and because it is subject to drift with respect to the time at which the RF signal leaves the magnetron as compared to the time at which it is triggered. This lack of coherence, as will be realized by those skilled in the art, would effectively proscribe use of magnetrons in Moving Target Indication (MTI) radars unless compensatory measures were taken. The coherence problem is overcome, as is well known, by taking a sample of the transmitted pulse at a directional coupler, mixing this pulse with the output of a stabilized local oscillator and using the resulting pulse to phase lock a coherent oscillator. The coherent oscillator then becomes a reference oscillator against which the received signals are compared for phase variation. However, the output of the magnetron, the magnetron current pulse (MCP), is typically delayed on the order of 7.5 microseconds from its trigger and may drift on the order of ±1.0 microseconds or more, due to variations in temperature, line voltage and so forth. As will be appreciated by those skilled in the art, this drift can degrade the overall MTI performance of a modern radar system.

It was, therefore, one object of this invention to reduce the effects of drift on performance of an MTI radar.

It is yet another object of this invention that an electronic trigger be provided for a magnetron whereby the magnetron current pulse emitted thereby will be emitted at a preselected time with a high degree of accuracy.

It is yet another object of this invention to improve electronic triggers for RF sources.

It was still another object of this invention that the electronic trigger be inherently stable.

The foregoing objects are achieved as is now described. A counter is loaded with a selected multi-bit binary number. This number is preferably derived from the contents of a delay accumulator. As will be seen, the magnitude of the number in the delay accumulator is adjusted up or down depending upon whether or not the RF energy is generated at the correct time. Receipt of a pretrigger signal causes the counter to initiate counting and upon reaching a predetermined value it generates a modulator trigger. The modulator trigger modulates the RF source, such as a magnetron, and sometime thereafter the RF source generates its RF energy. In the magnetron embodiment, the occurrence of the generated Magnetron Current Pulse (MCP) is compared with a timing signal which is preferably generated at the time that the MCP should desirously appear. Of course, in actual operation, the MCP will typically lead or lag this timing signal. A phase detector samples both the MCP and this timing signal and adjusts the magnitude of the number in the delay accumulator when the MCP leads or lags the timing signal by a predetermined amount (about 50 nanoseconds in the disclosed embodiment). Typically, the number in the delay accumulator is randomly selected when the system is first energized, decremented thereafter for each cycle in which the MCP leads the timing signal by at least the predetermined amount or incremented thereafter for for each cycle in which the MCP lags the timing signal by at least the predetermined amount.

The advantage of the invention, both as to its construction and mode of operation, and the preferred mode of use, it will be readily appreciated by those skilled in the art referring to the following detailed description of an illustrative embodiment when considered in conjunction with the accompanying drawings in which like reference numerals refer to the same composite throughout the drawings.

DETAILED DESCRIPTION OF AN ILLUSTRATIVE EMBODIMENT

Figure 1:
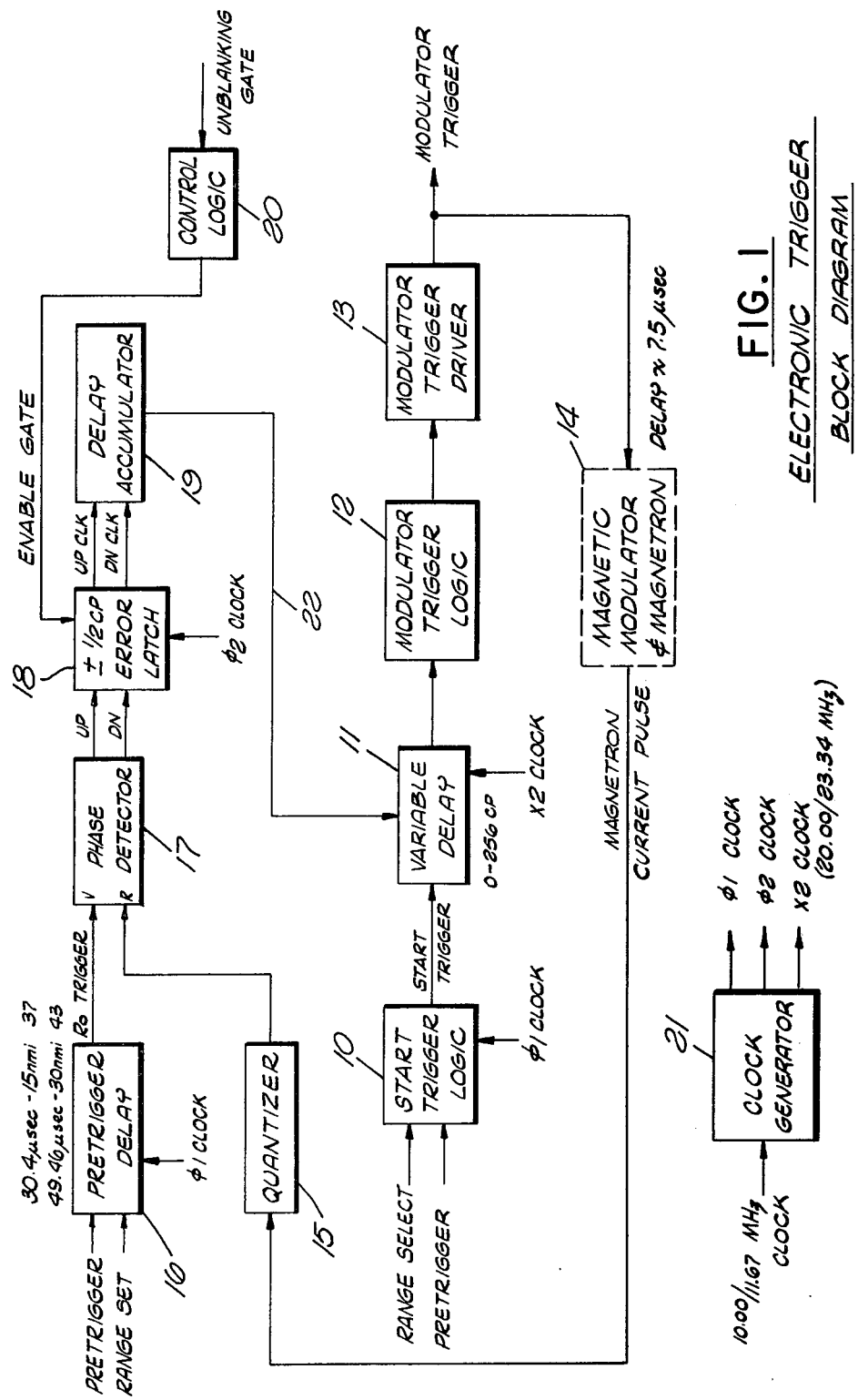
FIG. 1 is a simplified block diagram of an electronic trigger for an RF source.

Referring now to FIG. 1, there is shown a simplified block diagram of an electronic trigger for an RF source employing the present invention. The RF source, in this embodiment, is a magnetron which is driven by a magnetic modulator. The magnetron and its magnetic modulator are shown at block 14 of FIG. 1. The electronic trigger incorporates a digital control loop which is closed around the magnetic modulator and magnetron 14 as is shown in FIG. 1. The magnetic modulator and magnetron preferably should produce a stable current pulse in the magnetron from an externally supplied voltage pulse, called the Modulator Trigger. As has been previously described, a stable Magnetron Current Pulse (MCP) in the magnetron is very useful in achieving improved MTI performance when the present invention is used in a radar system. Typically, the MCP is delayed on the order of 7.5 microseconds from the Modulator Trigger and may drift up to ±1.0 microseconds due to temperature and line voltage-variations. In the embodiment of the electronic trigger described in connection with FIG. 1, this drift is limited to a variation of ±50 nanoseconds. Those skilled in the art realize that the present invention may be used to control the variation more tightly or less tightly than ±50 nanoseconds as a matter of design choice.

The reference timing pulse for the electronic trigger is a Pretrigger signal which, in this embodiment, is a trigger generated by the radar system which the disclosed electronic trigger utilizes to generate the Modulator Trigger applied to the magnetic modulator. The Pretrigger signal is processed by a start trigger logic 10, which, in turn, generates a Start Trigger signal whose leading edge, in this embodiment, is delayed by 22 microseconds from the leading edge of the Pretrigger when the radar system is in its 15 nautical mile mode or is delayed 41 microseconds from the leading edge of the Pretrigger when the radar system is in its 30 nautical mile mode. Inasmuch as the delay associated with start trigger logic 10 is range dependent, the start trigger logic 10 shown in FIG. 1 receives both the Pretrigger signal and a Range Select signal which identifies the particular range mode in which the radar is operating. Of course, the number of range modes (if any) and the delays associated with start trigger logic 10 (if any) are design choices. The Start Trigger signal is applied to a Variable Delay circuit 11 which, in this embodiment, inserts between 1 and 256 clock cycles of delay. The clock cycles here employed are derived from the X2 clock which has a 50 nanosecond period. Thus, the amount of delay insertable by Variable Delay circuit 11 occurs in 50 nanosecond increments. Of course, these increments may be made smaller by increasing the frequency of the X2 clock and conversely made larger by reducing the frequency of the X2 clock. The amount of delay inserted by Variable Delay circuit 11 is determined by an output received from a Delay Accumulator 19 via a bus 22. In this embodiment, an eight bit number is inserted from Delay Accumulator 19 via bus 22 into Variable Delay circuit 11 which, preferably, includes a counter which is loaded with this eight bit number and initiates counting on the Start Trigger signal from start trigger logic 10. The output from Variable Delay circuit 11 occurs, in this embodiment, when the counter in Variable Delay circuit 11 overflows.

The output of Variable Delay circuit 11 is applied to a Modulator Trigger logic 12 and a Modulator Trigger Driver 13 for producing the Modulator Trigger applied to the magnetic modulator.

The MCP occurs, as has been previously mentioned, approximately 7.5 microseconds after the occurrence of the Modulator Trigger. The MCP is transformed to appropriate logic levels, in this case TTL levels, by a Quantizer 15. The leading edge of the Quantized MCP is compared with the leading edge of a delayed Pretrigger signal, called the $R_o$ trigger, at a phase detector 17. The Pretrigger signal is delayed by a pretrigger delay circuit 16 for generating the $R_o$ trigger. Of course, the $R_o$ trigger occurs at the instant that the MCP is preferably generated. In actual operation, the $R_o$ trigger will either occur before or after the MCP due to the aforementioned drift characteristic. Utilizing this invention will reduce the error to an acceptable amount. Phase detector 17 measures phase error between the leading edges of the $R_o$ trigger and the Quantized MCP and outputs a pulse whose pulsewidth is proportional to the phase difference between the input signals. This error pulse is applied to an Error Latch 18 which sets the Up Latch when the MCP leads the $R_o$ trigger by more than 50 nanoseconds or which sets the Down Latch when the MCP lags the $R_o$ trigger by more than 50 nanoseconds. The output of Error Latch 18 is applied to Delay Accumulator 19 for incrementing the value therein whenever the MCP lags the $R_o$ trigger or for decrementing the value therein whenever the MCP leads the $R_o$ trigger. For example, the value in the Delay Accumulator 19 is preferably incremented by one count to decrease the amount of delay imposed by variable delay circuit 11, which will then require one less cycle of the X2 clock to overflow, thereby causing the MCP in the subsequent triggering operation to occur 50 nanoseconds sooner with respect to the pretrigger.

As will be apparent to those skilled in the art, this electronic trigger is inherently stable inasmuch as the maximum amount of error correction from trigger-to-trigger operation is 50 nanoseconds. Thus, for this electronic trigger to adequately follow the drift in the magnetic modulator and magnetron circuit 14, the drift associated therewith, although it may be relatively large in magnitude, should preferably be sufficiently stable that the drift rate not exceed 50 nanoseconds per trigger operation. Of course, inasmuch as the trigger operations occur at the radar's Pulse Repetition Frequency (PRF), this is a relatively minor and easily obtainable constraint. Moreover, it should be readily apparent to those skilled in the art that my electronic trigger may be modified, if desired, to utilize the phase detector 17 to increment or decrement the number in Delay Accumulator 19 by an amount which is a function of the pulsewidth of the error pulse outputted from phase detector 17. In this case, the output of the phase detector is used to increment or decrement the number in Delay Accumulator 19 for as many clock periods as the error pulse is present. I prefer, when practicing the present invention, to either increment or decrement the quantity in Delay Accumulator 19 by one count per trigger operation because of the high degree of stability obtained thereby and because the aforementioned constraint with respect to the drift rate of the magnetic modulator and magnetron circuit is easily obtainable.

Some practicing the present invention may desire, as a matter of design choice, to modify the contents of Delay Accumulator 19 only during that time at which the radar display is blanked so that any necessary corrective actions are performed only during nondisplay times. This may be desirable in some applications due to noise considerations. Thus, an unblanking signal may be applied to a control logic 20 for generating an enabling signal for controlling the loading Error Latch 18. It should be noted, however, that in many applications it will be either undesirable or unnecessary to perform the corrective action only during nondisplay times and, therefore, control logic 20 and the enable signal applied to Error Latch 18 need not be utilized.

Figure 2:
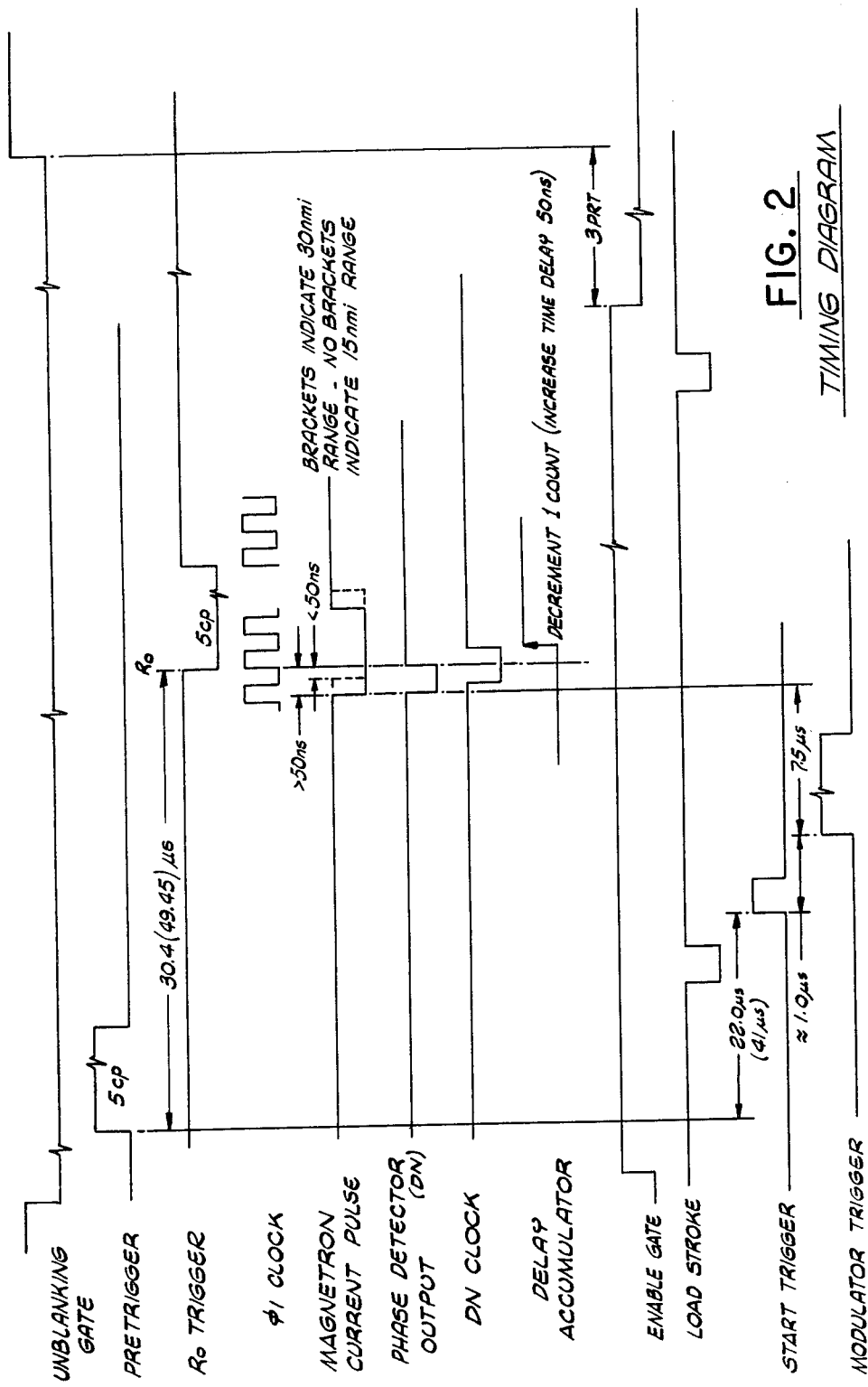
FIG. 2 is a timing diagram for electronic trigger of FIG. 1.

Referring now to FIG. 2, there shown a timing diagram for the various signals generated by the electronic trigger of FIG. 1. The Pretrigger occurs at a given time and, as aforementioned, the pretrigger delay circuit 16 generates the $R_o$ trigger at a predetermined time thereafter, which is determined in this embodiment by the particular range in which the radar system is operating. The MCP is here shown occurring before its desired time, that is, before the $R_o$ trigger. The solid line representation of the MCP shows it leading the $R_o$ trigger by more than 50 nanoseconds whereas the dotted line MCP leads the $R_o$ trigger by less than 50 nanoseconds. The Phase Detector output occurs on the down output for the period of time by which the MCP leads the $R_o$ trigger. Inasmuch as in example shown the phase detector output occurs for more than 50 nanoseconds (solid line MCP), the output of the Error Latch 18, "Down Clock" occurs for one clock cycle and the number in the Delay Accumulator is decremented by one count, thereby increasing the delay time in variable delay circuit 11 by 50 nanoseconds. Of course, increasing the delay time in Variable Delay circuit 11 by 50 nanoseconds will cause the next successive MCP to occur 50 nanoseconds sooner and within the desirable error range.

Also shown in FIG. 2 is the Start Trigger Signal occurring at 22 microseconds (in the 15 nmi mode) or 41 microseconds (in the 30 nmi load) after the leading edge of the Pretrigger. Of course, the Modulator Trigger occurs on the order of one microsecond after the Pretrigger, the amount being dependent upon the amount of delay in Variable Delay circuit 11. The MCP occurs, in this embodiment, approximately 7.5 microseconds after the leading edge of the modulator trigger.

Figure 3:
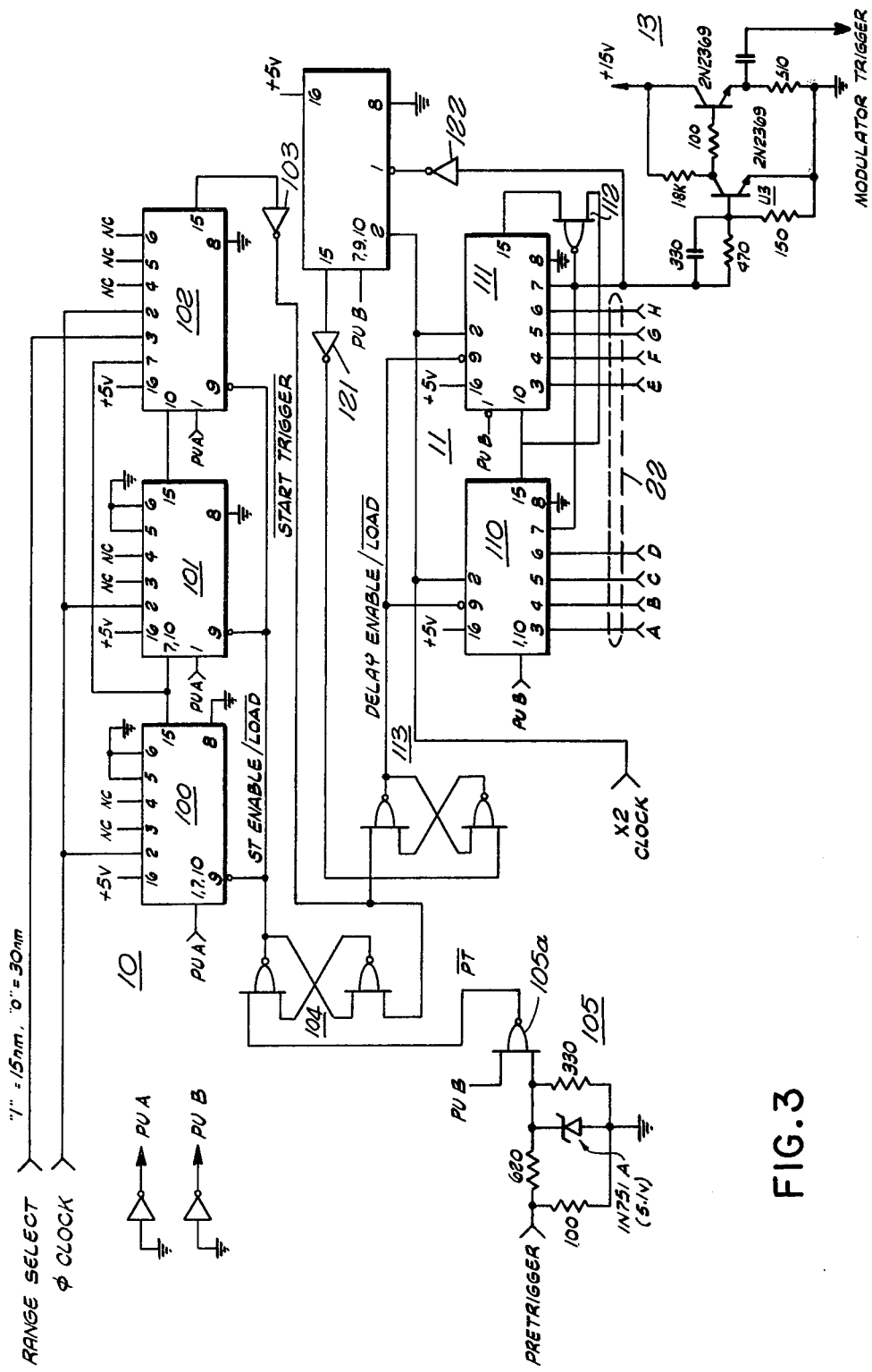
FIG. 3 is a detailed logic diagram of the Start Trigger logic, Variable Delay circuit, Modulator Trigger logic and Modulator Trigger Driver.

Turning now to FIG. 3 there is shown a detailed logic diagram of Start Trigger logic 10, Variable Delay circuit 11, Modulator Trigger logic 12 and Modulator Trigger Driver 13. The Pretrigger signal, in this embodiment, is an 11 volt signal which is converted to TTL levels by level changer 105, which includes a Schmidt trigger 105a for reducing spurious responses to noise. The output of the Schmidt trigger, $\overline{PT}$, is applied as an input to a latch 104 formed by cross coupled NAND gates. An output of latch 104 is a ST Enable/Load signal which is in turn applied to the "load" inputs of IC's 100–102. These IC's as well as the rest of the IC's described herein correspond to the type numbers set forth in Table I. IC's 100–102 are each four bit binary counters which form a twelve bit register for Start Trigger logic 10. The amount of delay in Start Trigger logic 10 is determined according to the state of the Range Select signal which is applied to one of the data inputs of the IC 102. The remaining data inputs of IC's 100–102 are either grounded to load a zero or allowed to float, which loads a zero in these chips. When ST Enable/$\overline{Load}$ is low, the number representing the desired amount of delay is loaded herein according to the data appearing upon the data input pins (2–6) of each IC 100–102. When ST Enable/$\overline{Load}$ goes high in response to a received Pretrigger signal, the registers formed by IC's 100–102 commence counting. When an overflow occurs, a carry signal is generated at pin 15 of IC 102, which in turn generates the $\overline{Start\ Trigger}$ signal outputted from an inverter 103. The $\overline{Start\ Trigger}$ signal causes a latch 113 formed by a pair of cross-coupled NAND gates to change state, which controls IC's 110–111 in a similar manner to which latch 104 controls IC's 100–102. IC's 110–111 form an eight bit counter in Variable Delay circuit 11, which, as previously mentioned, is loaded with the eight bit number from Delay Accumulator 19 via bus 22. Thus, when a Delay Enable/$\overline{Load}$ signal from latch 113 goes high, the counter formed by IC's 110–111 commences counting until an overflow condition occurs in both IC's. At this time the output of a NAND gate 112, whose inputs are coupled to the carry outputs of both IC's 110 and 111, goes low thereby inhibiting further counting by IC's 110–111 and generating the Modulator Trigger signal which is outputted from Modulator Trigger Driver 13. The Modulator Trigger preferably occurs for ten clock cycles due to a Modulator Trigger logic 12 which includes a counter 120 arranged to count ten clock cycles and inverters 121 and 122. The output of NAND gate 112 is coupled via inverter 122, IC 120 and inverter 121 to latch 113 for resetting that latch. Resetting latch 113 loads the data on bus 22 into the counter formed by IC's 110–111 which, of course, clears the carry condition, resets the output of NAND gate 112 and clears the Modulator Trigger signal. By this means, the Modulator Trigger signal outputted from Modulator Trigger Driver 13 appears for ten clock cycles.

Figure 4:
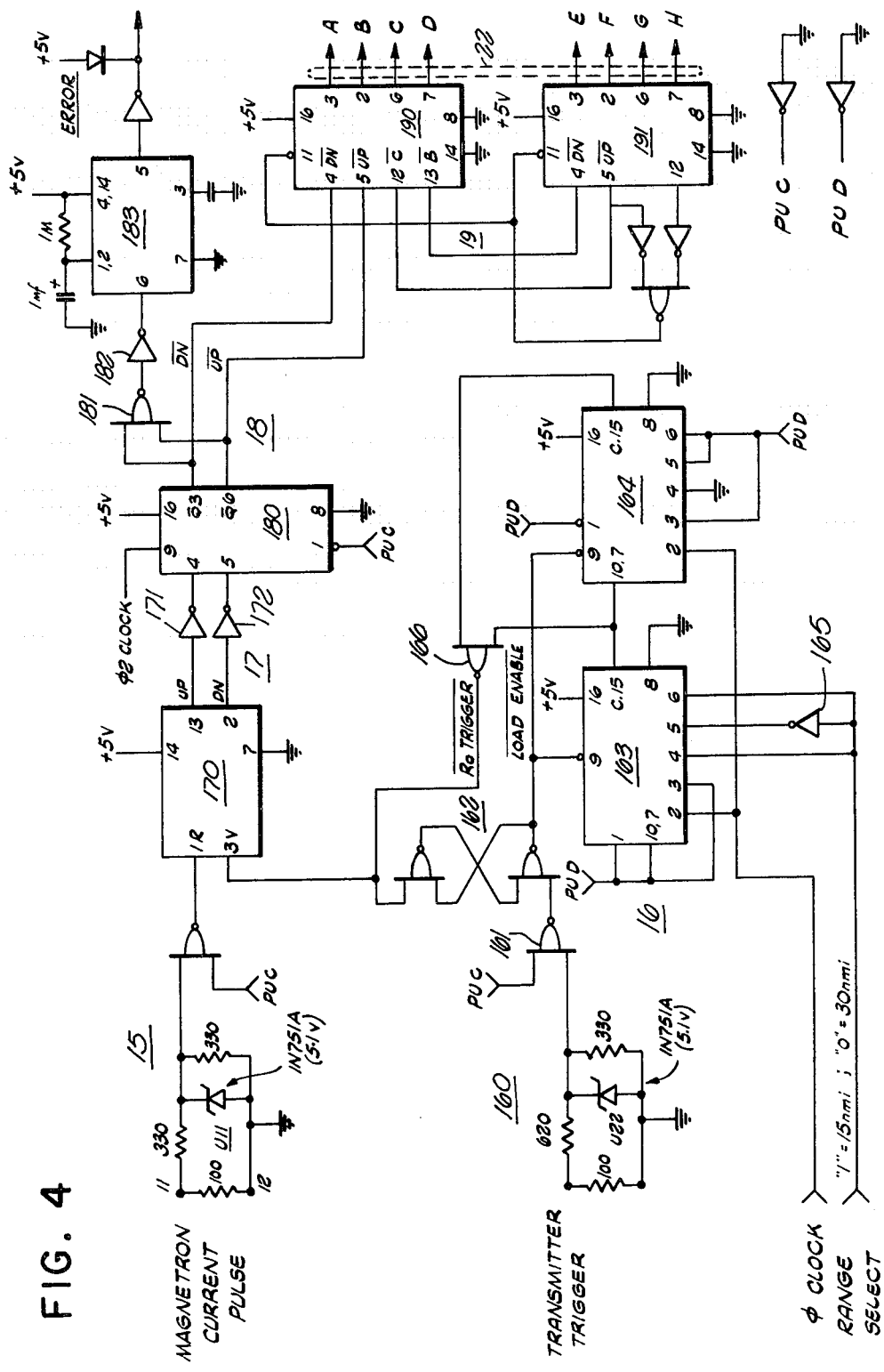
FIG.4 is a detailed logic diagram of the Pretrigger Delay circuit, Quantizer, Phase Detector, Error Latch and Delay Accumulator.

Referring now to FIG. 4, there is shown a detailed logic diagram of Pretrigger Delay circuit 16, Quantizer 15, Phase Detector 17, Error Latch 18 and Delay Accumulator 19. The Pretrigger Delay 16 differs slightly from the Pretrigger Delay circuit described with reference to FIG. 1 inasmuch as here the Pretrigger Delay circuit 16 is responsive to a Transmitter Trigger signal provided by the radar transmitter which signal is delayed by a predetermined amount from the Pretrigger signal. Thus, the amount of delay imposed by Pretrigger Delay circuit 16 is less than described with reference to FIGS. 1 and 2. This can be seen on the timing diagram of FIG. 6. Delay circuit 16 includes a level changing circuit 160 for changing the Transmitter Trigger to TTL levels a Schmidt trigger 161 for reducing spurious responses to noise, a latch 162 (formed by cross-coupled NAND gates) a counter formed by IC's 163–164 and an inverter 165. Delay circuit 16, as can be seen from FIG. 4, inserts an amount of delay which is determined by the range mode selected and, therefore, the counter formed by IC's 163 and 164 is responsive to the Range Select signal via inverter 165 for loading a range dependent number therein. Latch 162 is toggled by a received Transmitter Trigger signal which causes the number loaded into the counter formed by IC's 163–164 to be incremented in time with the $\phi1$ clock. When both IC's 163–164 overflow, the $\overline{R_O\ Trigger}$ signal is generated at the output of a NAND gate 166 whose inputs are coupled to the carry outputs of IC's 163 and 164. The $\overline{R_O\ Trigger}$ signal, besides resetting latch 162, is applied as an input to the Phase Detector circuit 17 which includes a phase detector IC 170. The other input to phase detector IC 170 is the MCP after being changed to TTL levels by Quantizer 15. The outputs of IC 170 are inverted by inverters 171 and 172 and applied to inputs of an IC 180 in Error Latch 18. IC 180 is responsive to a $\phi2$ clock in lieu of the $\phi1$ clock as is the rest of the circuitry and, therefore, any output from IC 170 occurring for less than 50 nanoseconds is ignored by IC 180. However, should one of the two outputs from IC 170 go high for more than 50 nanoseconds, one of the latches in IC 180 will set itself providing an output, in false logic, on either pins 3 or 6 thereof. These outputs are connected as inputs to a NAND gate 180 whose output is inverted by an inverter 182 and thence applied to a one-shot IC 183 for providing an Error indication of approximately 2 seconds duration whenever correction occurs. The $\overline{DN}$ and $\overline{UP}$ outputs from pins 3 and 6 of IC 180 are applied to the $\overline{DN}$ and $\overline{UP}$ inputs of the Delay Accumulator 19. The Delay Accumulator 19 includes a pair of synchronous four-bit Up/Down counters IC's 190 and 191. Thus, whenever an error condition appears as a low level signal on pins 3 or 6 of IC 180 the number in the counter formed by IC's 190 and 191 is either decremented or incremented one count. The eight-bit number in this counter is supplied, as aforementioned, to the counter formed by IC's 110–111 via bus 22.

Figure 5:
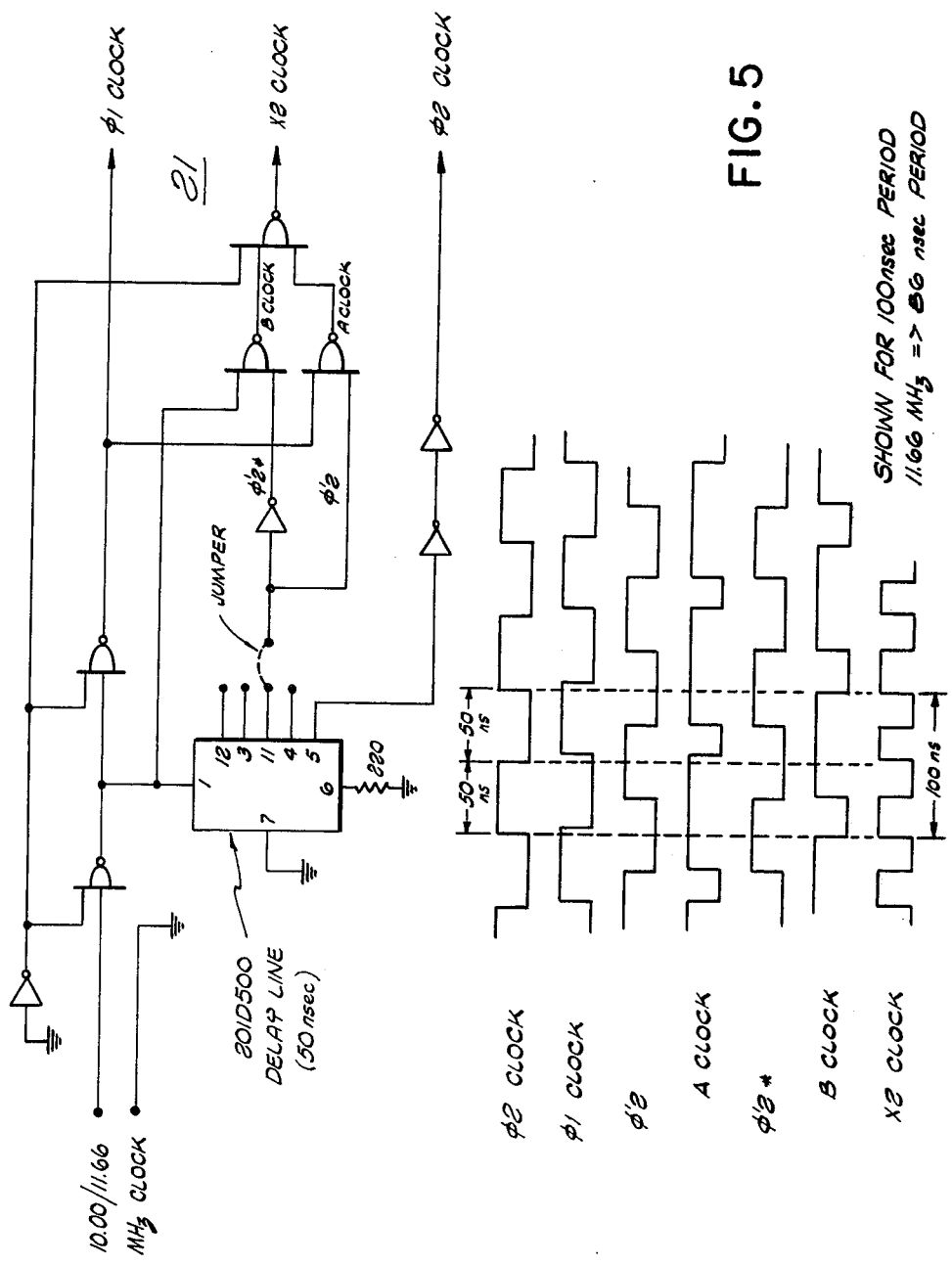
FIG. 5 is a detailed logic diagram of the Clock Generator and a timing diagram of the clocks generated thereby.

Referring now to FIG. 5, there is shown a detailed logic diagram of the clock generator 21 which may be used with the electronic trigger and a timing diagram of the clocks generated thereby. Preferably, in 15 nmi mode this radar system has a nominal clock frequency of 10.0 MHz (which corresponds to a period of 100 nanoseconds). Thus, the $\phi 1$ and $\phi 2$ clocks are shown having a 100 nanoseconds period while the X2 clock is shown having a 50 nanosecond period. Preferably, and as a matter of design choice, when the radar system shifts to the 30 nmi mode the clock frequency of the radar system increases to 11.66 MHz which corresponds to an 86 nanosecond period for the $\phi 1$ and $\phi 2$ clocks and a 43 nanosecond period for the X2 clock. Accordingly, in the 30 nmi mode, the electronic trigger using the clock generator 21 of FIG. 5 will invoke a correction whenever the MCP and the $R_O$ trigger differ by more than 43 nanoseconds.

Figure 6:
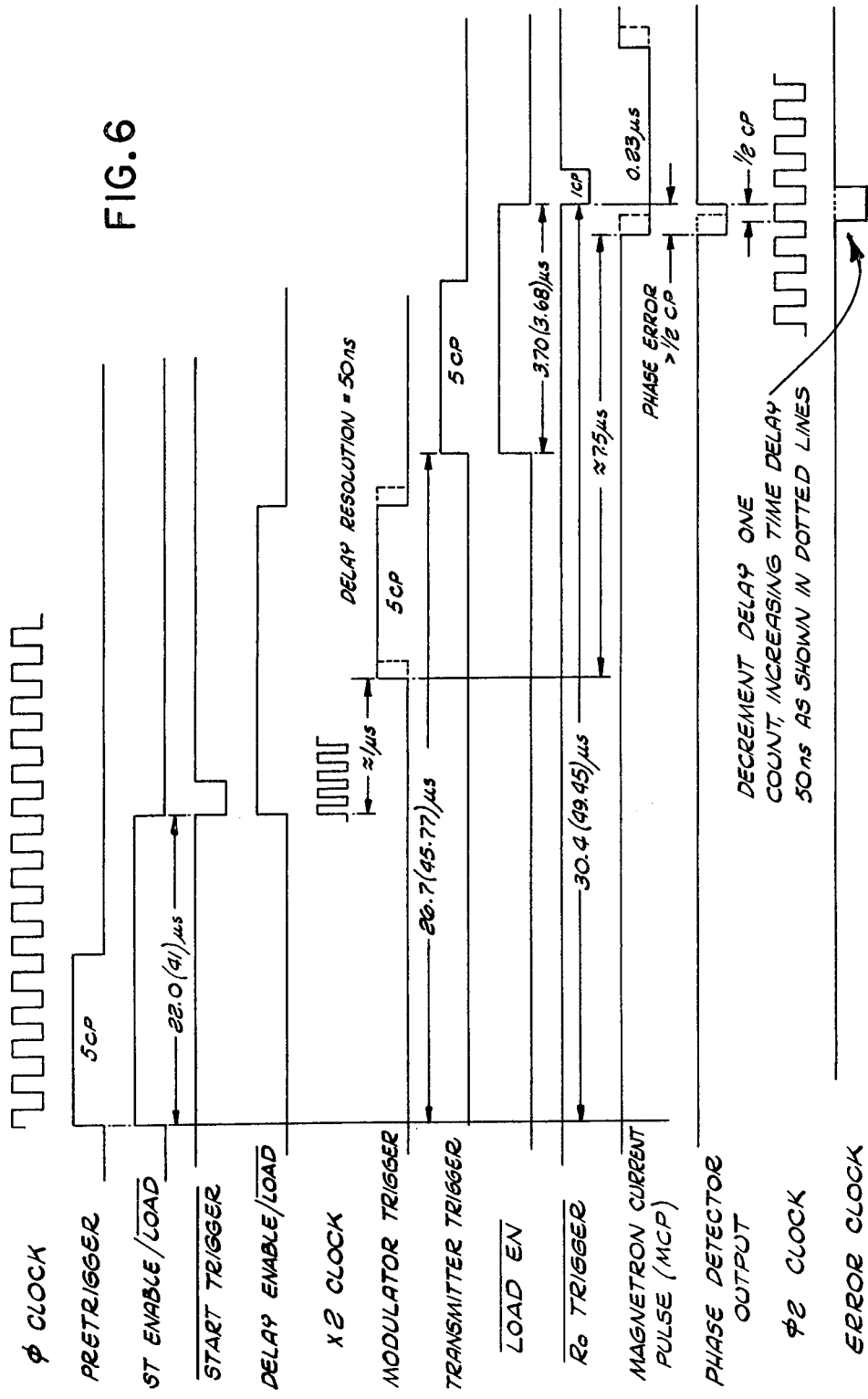
FIG. 6 is a timing diagram of the various signals generated by the logic circuits of FIGS. 3—5.

FIG. 6 is a timing diagram for the detailed logic diagram of FIGS. 3–5 and generally corresponds to the timing diagram of FIG. 2. Hence, it is believed that it is self-explanatory and therefore, not described in detail herein.

I have described my invention in connection with a block diagram thereof as well as in connection with detailed logic diagrams of an illustrative embodiment thereof. It is to be understood, of course, that modification will now suggest itself to those skilled in the art. By way of example, and not limitation, those skilled in the art will realize that other logic systems than the TTL system described herein may be used as a matter of design choice. Furthermore, the illustrated interconnection of TTL logic elements is but one of many possible embodiments which will become apparent to those skilled in the art and, of course, the particular clock periods and bits per counter are a matter of design choice. Also, it should be apparent that the X2 clock may be any multiple of the $\phi 1$ clock so long as the phase difference between the $\phi 1$ and $\phi 2$ clock is approximately equal to the period of the X2 clock. For example, if the $\phi 1$ and $\phi 2$ clocks had 100 nanosecond periods as shown in my preferred embodiment, but the X2 clock had a 25 nanosecond period and the phase difference between the $\phi 1$ and $\phi 2$ clocks were 25 nanoseconds, then my electronic trigger would correct errors to within 25 nanoseconds. Of course, the number of bits in counters 11 and 120 and accomulator 19 may need to be correspondingly increased. My invention is not limited to the embodiments disclosed except as set forth in the appended claims.

TABLE I

| Integrated Circuits (IC's) corresponding to the logic circuit IC's set out in FIGS. 3 and 4. | | |
| --- | --- | --- |
| IC NO. | PART NO. | MANUFACTURER |
| 100 | SN 54S163 | Texas Instruments |
| 101 | " | Texas Instruments |
| 102 | " | Texas Instruments |
| 110 | " | Texas Instruments |
| 111 | " | Texas Instruments |
| 120 | SN 54S162 | Texas Instruments |
| 163 | SN 54S163 | Texas Instruments |

TABLE I-continued

| Integrated Circuits (IC's) corresponding to the logic circuit IC's set out in FIGS. 3 and 4. | | |
| --- | --- | --- |
| IC NO. | PART NO. | MANUFACTURER |
| 164 | " | Texas Instruments |
| 170 | MC 4344 | Motorola |
| 180 | SN 54S175 | Texas Instruments |
| 183 | 556 | Signetics |
| 190 | SN 54LS193 | Texas Instruments |
| 191 | " | Texas Instruments |

What is claimed is:

1. An electronic trigger controller for an RF source, said controller being responsive to a trigger signal and comprising:
   a. a register;
   b. means responsive to said trigger signal for enabling counting in said register in response thereto;
   c. means responsive to a selected count in said register for enabling said RF source;
   d. means for generating a timing signal in a timed relationship to the time which said RF source should nominally generate its RF signal;
   e. means for comparing the phase relationship between the occurrence of said timing signal and the initiation of said RF signal; and
   f. means responsive to said comparing means for altering the number of states through said register counts when enabled by said trigger.

2. An electronic trigger as defined in claim 1 wherein said altering means only alters the number of states through its said register counts when said comparing means determines that the phase relationship between the occurrence of said trigger signal and the initiation of said RF signal differs by a preselected amount.

3. An electronic trigger as defined in claims 1 or 2, further including a clock generator for generating a first clock of preselected period, a second clock having the same period as said first clock but having a different phase than said first clock and a third clock occurring as a multiple of the first clock, wherein said register counts in time with said third clock, wherein said trigger signal and timing signal occur essentially in time with said first clock, and wherein said altering means is operated essentially in time with said second clock.

4. An electronic trigger controller as defined in claim 1, wherein said altering means include a delay accumulator for storing a number, error latch and means for storing the number stored in said delay accumulator in said register, said error latch being set in one condition when said comparing means determines that said timing signal lags said RF signal and wherein said delay accumulator increments the number stored therein in response to said error latch being set in a selected one of its conditions and decrements the number stored therein in response to said error latch being set to the other one of its conditions.

5. An electronic trigger controller as defined in claim 1, wherein said means responsive to a selected count in said register is responsive to an overflow condition in said register and wherein said altering means includes a delay accumulator for storing a number, an error latch and means for storing the number stored in said delay accumulator in said register said error latch being set to a first condition when said comparing means determines that said timing signal leads said RF signal and being set to a second condition when said comparing means determines that said timing signal lags said RF signal, said delay accumulator in response to said error latch being set to said second condition.

6. An electronic trigger controller as defined in claim 1, wherein said means responsive to a selected count in said register is responsive to an overflow condition in said register and wherein said altering means includes a delay accumulator for storing a number, an error latch and means for storing the number stored in said delay accumulator in said register said error latch being set to a first condition when said comparing means determines that said timing signal leads said RF signal by a preselected amount, and being set to a second condition when said comparing means determines that said timing signal lags by said preselected amount, said delay accumulator being incremented response to said error latch being in said first condition and decremented in response to said error latch being in said second condition.

7. An electronic trigger controller according to claim 5 or 6, further including a clock generator for generating a first clock of preselected period, a second clock having the same period as said first clock but having a different phase than said first clock and a third clock occurring as a multiple of the first clock, wherein said register counts in time with said first clock, wherein said register counts in time with said third clock, wherein said trigger signal and timing signal occur essentially in time with said first clock, and wherein said altering means is operated essentially in time with said second clock.

8. An electronic trigger controller as defined in claim 7, wherein said second clock occurs in approximately a 180 degree relationship to said first clock and wherein said third clock has twice the frequency as said first clock.

9. A method of controlling an RF source to output RF energy at a preselected time in response to a pretriggering signal, said method comprising steps of:
   a. storing a selected number in a counter;
   b. initiating counting by said counter in response to the occurrence of said pretriggering signal;
   c. modulating said RF source in response to said counter reaching a preselected count;
   d. generating a timing signal in timed-relationship to the time at which the RF signal should nominally generate its RF energy;
   e. comparing the time relationship between the occurrence of said timing signal and the generation of RF energy by said RF source; and
   f. modifying said selected number based upon results of the comparing step.

10. The method according to claim 9, wherein said modifying step increments or decrements said selected number whenever the time relationship between the occurrence of the timing signal and the generation of RF energy by said RF source differs by a preselected period of time.

11. A method of controlling an RF source to output RF energy at preselected time in response to a pretriggering signal, said method comprising the steps of:
   a. storing a selected number in a counter;
   b. initiating counting in said counter in response to the occurrence of said pretriggering signal;
   c. modulating said RF source in response to said counter reaching a selected count;
   d. generating a timing signal in timed relationship to the time at which said RF source should nominally generate its RF energy;
   e. comparing the time relationship between the occurrence of said timing signal and the generation of RF energy by said RF source; and
   f. changing the number of states through which said counter will subsequently count based upon the results of said comparing step.

12. The method according to claim 11, wherein the changing step increments or decrements the number states through which the counter counts whenever the time relationship between the occurrence of said timing signal and the generation of RF energy by said RF source differs by a preselected amount.

13. The method according to claim 12 wherein the changing step increments said number whenever the timing signal leads the RF energy and decrements said number whenever the timing signal lags the RF energy.

* * * * *